United States Patent [19]

Lowenschuss

[11] Patent Number: 4,558,282
[45] Date of Patent: Dec. 10, 1985

[54] DIGITAL FREQUENCY SYNTHESIZER

[75] Inventor: Oscar Lowenschuss, Goleta, Calif.

[73] Assignee: Raytheon Company, Lexington, Mass.

[21] Appl. No.: 455,399

[22] Filed: Jan. 3, 1983

[51] Int. Cl.$^4$ .......................... H03K 9/06; H03K 3/78
[52] U.S. Cl. ..................................... 328/14; 307/523; 307/522; 307/524
[58] Field of Search .................. 328/14; 307/523, 524, 307/522

[56] References Cited

U.S. PATENT DOCUMENTS

| | | | |
|---|---|---|---|
| 3,464,018 | 8/1969 | Cliff | 328/61 |
| 3,882,403 | 5/1975 | Gerken | 328/14 |
| 4,240,034 | 12/1980 | Lowenschuss | 328/14 |
| 4,318,045 | 3/1982 | Krupa et al. | 328/18 |
| 4,437,066 | 3/1984 | Gordon | 328/14 |

Primary Examiner—Stanley D. Miller
Assistant Examiner—Richard Roseen
Attorney, Agent, or Firm—Richard M. Sharkansky; Joseph D. Pannone

[57] ABSTRACT

A digital frequency synthesizer is provided for producing a signal having a predetermined frequency. Such system includes: a computer for calculating the residue of the frequency to be synthesized modulo a predetermined frequency, $f_{LO}$, and the nearest modulus frequency; an intermediate frequency generator for generating an intermediate frequency signal having a frequency equal to the determined residue; a harmonic generator section for combining the intermediate frequency signal with a plurality of harmonics of the predetermined frequency, $f_{LO}$, to produce a composite signal having a plurality of frequency components separated one from another by the predetermined frequency, $f_{LO}$, one of such produced plurality of frequency components having the frequency of the signal being synthesized; and, a selector section fed by the composite signal and responsive to the determined nearest modulus frequency, for coupling the one of the produced plurality of frequency components of the composite signal having the frequency of the signal being synthesized to an output while rejecting the remaining ones of the produced plurality of frequency components of the composite signal.

4 Claims, 8 Drawing Figures

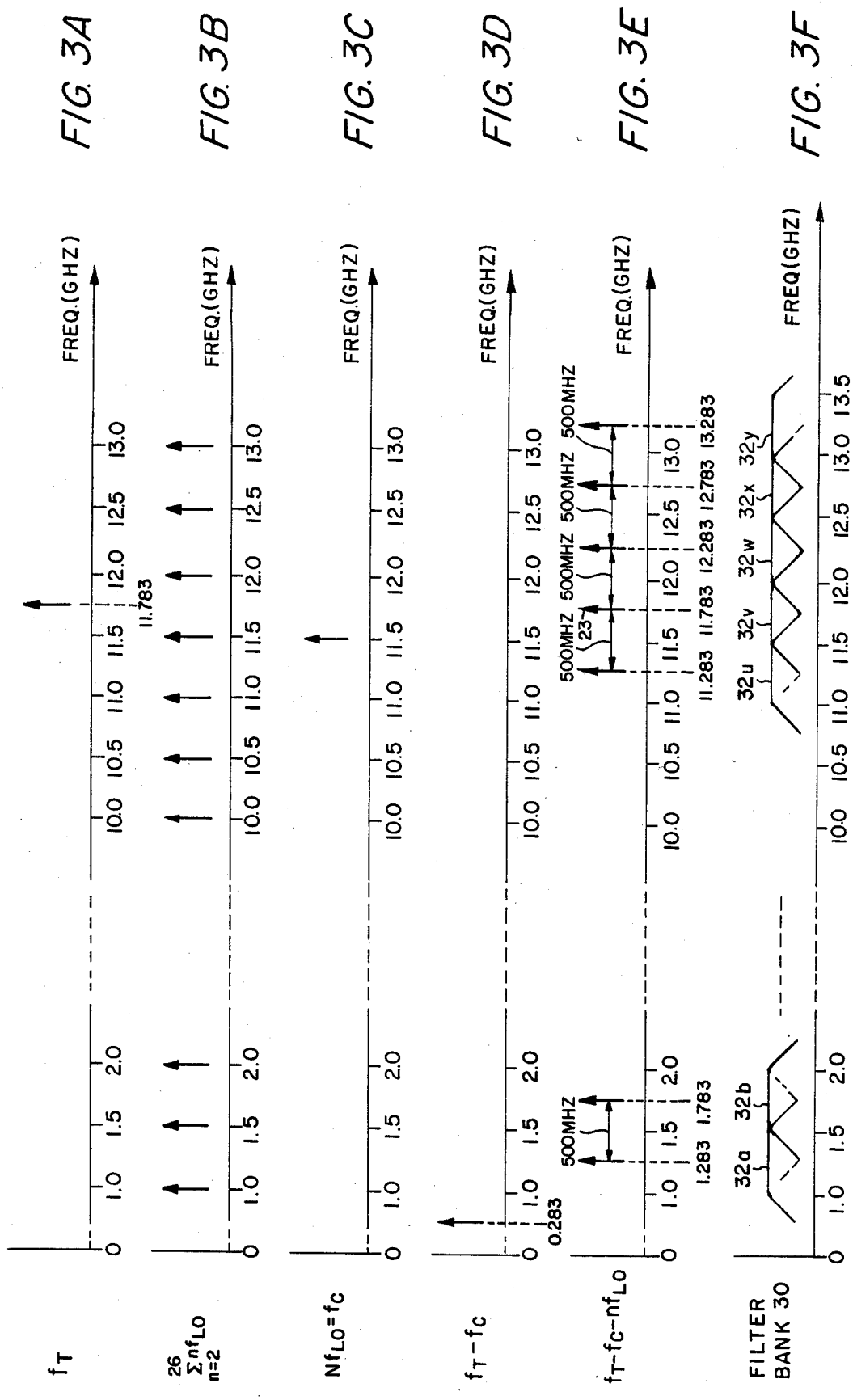

DIGITAL FREQUENCY SYNTHESIZER

BACKGROUND OF THE INVENTION

This invention relates generally to frequency synthesizers and more particularly to digital synthesizers adapted to produce radio frequency signals.

As is known in the art, one type of digital frequency synthesizer includes a plurality of highly stable oscillators coupled to a plurality of counters of frequency multipliers to produce subharmonic frequency signals. These signals are then selectively combined using mixers and filters to produce a signal having the desired frequency. Such apparatus is expensive and not generally suited to produce signals having relatively short time durations such as pulses used in radio and pulse communications systems.

Another type of a digital frequency synthesizer is described in my U.S. Pat. No. 4,240,034, issued Dec. 16, 1980 and assigned to the same assignee as the present invention. As described in my patent a digital frequency synthesizer is adapted to produce radio frequency signals having a predetermined frequency. While such frequency synthesizer is useful in many applications it is sometimes desired to provide a digital frequency synthesizer adapted to produce radio frequency signals having a frequency within an extremely wide band of frequencies.

SUMMARY OF THE INVENTION

In accordance with the present invention, a digital frequency synthesizer is provided for producing a signal having a predetermined frequency. Such system includes: means for determining the residue of the frequency to be synthesized modulo a predetermined frequency, $f_{LO}$, and the nearest modulus frequency; means for generating an intermediate frequency signal having a frequency equal to the determined residue; means for combining the intermediate frequency signal with a plurality of harmonics of the predetermined frequency, $f_{LO}$, to produce a composite signal having a plurality of frequency components separated one from another by the predetermined frequency, $f_{LO}$, one of such produced plurality of frequency components having the frequency of the signal being synthesized; and, means, fed by the composite signal and responsive to the determined nearest modulus frequency, for coupling the one of the produced plurality of frequency components of the composite signal having the frequency of the signal being synthesized to an output while rejecting the remaining ones of the produced plurality of frequency components of the composite signal.

In a preferred embodiment of the invention, a digital frequency synthesizer is provided having means for producing a signal indicative of the one of a plurality of harmonics of a predetermined fundamental frequency separated from the frequency of the signal being synthesized an amount less than the predetermined fundamental frequency; means for producing a signal having a frequency equal to one of the differences between the frequency of the signal being synthesized and the frequency of the one of the harmonics which is less than the predetermined frequency; means for mixing the produced signal with the plurality of harmonics and for producing a composite signal having a plurality of frequency components separated by the fundamental frequency, one of such produced frequency components having the frequency of the signal being synthesized; and means, responsive to the signal indicative of the one of the plurality of harmonics of the predetermined fundamental frequency separated from the frequency of the signal being synthesized an amount less than the predetermined fundamental frequency, and fed by the composite signal for passing the one of the produced frequency components of the composite signal having the frequency of the signal being synthesized while rejecting the other ones of the produced frequency components of the composite signal.

With such an arrangement, a digital frequency synthesizer is provided adapted to produce a radio frequency signal having a predetermined frequency within a relative wide range of frequencies.

BRIEF DESCRIPTION OF THE DRAWINGS

The invention will be more fully understood from the following description taken in conjunction with the accompanying drawings in which.

DESCRIPTION OF A PREFERRED EMBODIMENT

Figure 1:
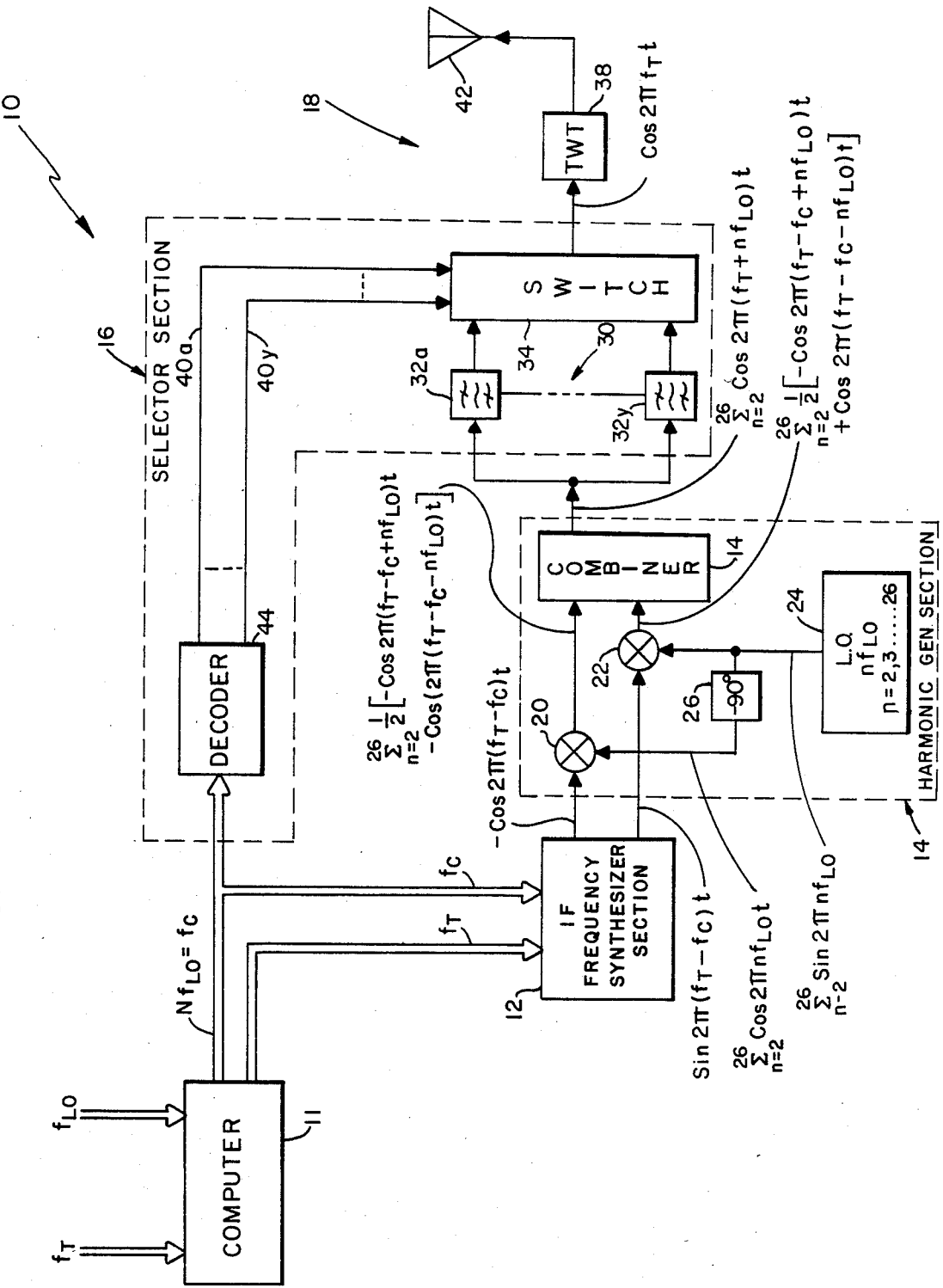
FIG. 1 is a block diagram of a frequency synthesizer according to the invention.

Referring now to FIG. 1, a frequency synthesizer 10 is shown to include a computer 11 responsive to: a digital signal representative of a radio frequency, $f_T$, to be synthesized; and, a predetermined local oscillator signal frequency $f_{LO}$. The local oscillator signal frequency has harmonics $n-f_{LO}$ where $n=2, 3, \ldots,$ $(N-1), N, (N+1), \ldots$ etc., as shown in FIG. 3B for an $f_{LO}=0.5$ GHz. The computer 11 calculates an intermediate frequency equal to the difference between the frequency to be synthesized $f_T$ and the one of the harmonics of the local oscillator signal (i.e. $Nf_{LO}$) which is separated in frequency from the frequency to be synthesized by an amount less than the frequency of the local oscillator signal. That is the intermediate frequency, $(f_T - Nf_{LO})$, has a frequency equal to the frequency of the signal to be synthesized modulo the frequency of the local oscillator signal. The computer 11 also calculates a signal indicative of the one of the harmonics of the local oscillator signal which is separated from the frequency to be synthesized an amount less than the local oscillator signal (i.e. a frequency $Nf_{LO}=f_c$; the frequency of the nearest modulus). Also included in synthesizer 10 are an intermediate frequency synthesizer section 12 adapted to produce "in-phase" and "quadrature" components of signals having the frequency of the calculated intermediate frequency; a harmonic generator section 14 adapted to produce a composite signal having a plurality of frequency components separated one from another by the frequency of the local oscillator signal, one of such frequency components having the frequency being synthesized, $f_T$; a selector section 16 adapted to selectively couple the one of the frequency components of the composite signal having the frequency $f_T$ to be synthesized while rejecting the other ones of the frequency components of the composite signal; and, a transmitter section 18, responsive to the one of the frequency components of the composite signal passed by the selector section 16 and having the frequency being synthesized and for transmitting such passed signal for transmission as a radio frequency signal.

Figure 2:
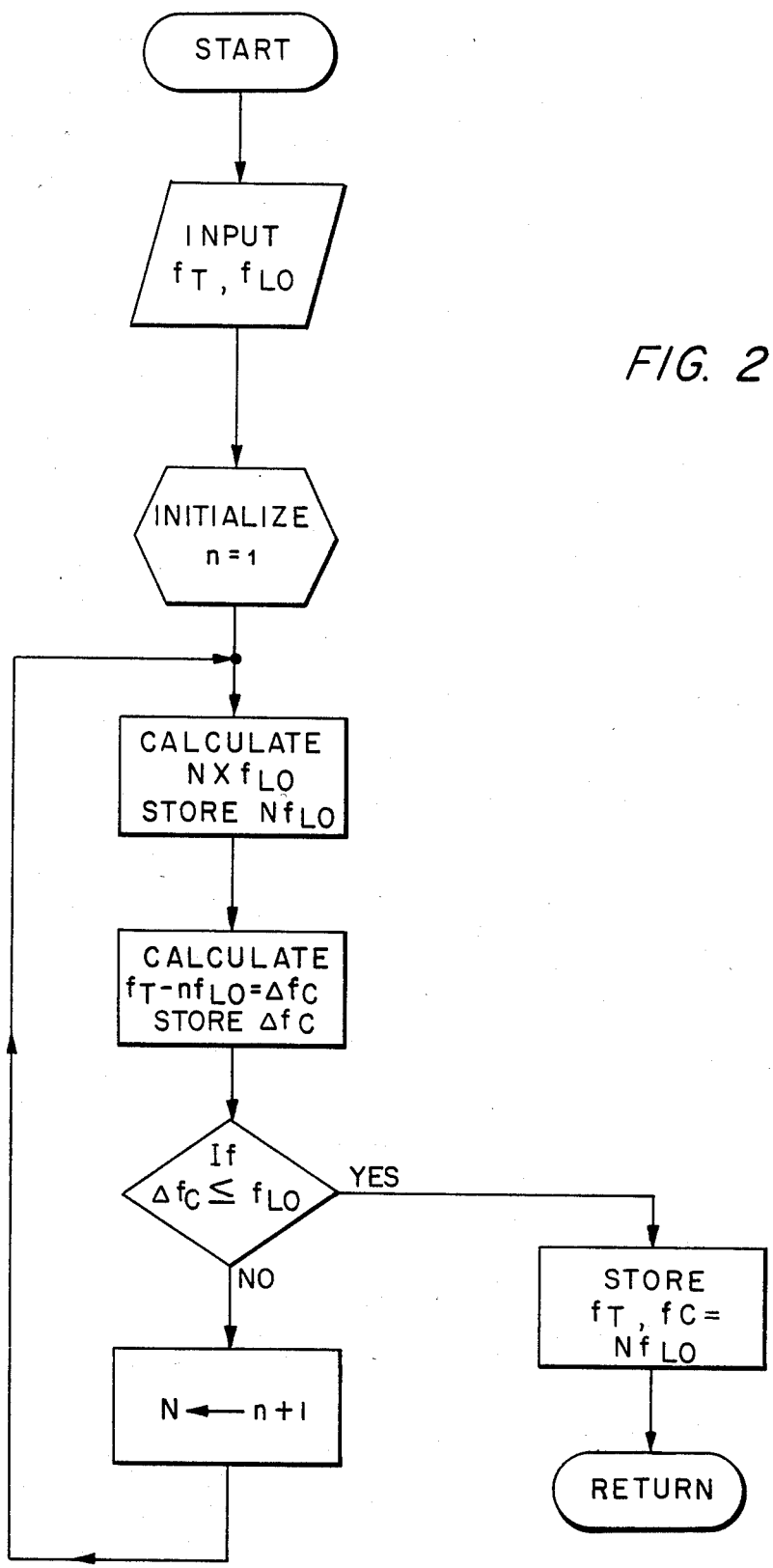
FIG. 2 is a flow chart useful in understanding the operation of a computer included in the invention of FIG. 1; and, FIGS. 3A–3F are frequency diagrams useful in understanding the invention.

Referring now to FIG. 2, a flow chart shows the computations provided by the computer 11. Thus the frequency being synthesized, $f_T$ and the local oscillator signal frequency ($f_{LO}$) are inputted to computer 11 while the computer has a variable "n" initialized to a count of one. The computer calculates the product of the variable n and the frequency of the local oscillator signal with the calculated product being subtracted from the frequency being synthesized. A comparison is made between the calculated difference (i.e. $f_T - Nf_{LO} = \Delta f_c$) and the frequency ($f_{LO}$) of the local oscillator signal is used to determine whether such difference $\Delta f_c$ is greater than or less than the frequency ($f_{LO}$) of the local oscillator signal. If this difference ($\Delta f_c$) is less than the frequency $f_{LO}$, the calculating process stops and the value N of the variable n together with the product $Nf_{LO} = f_c$ and the frequency of the transmitted signal ($f_T$) are stored and are used as inputs to the intermediate frequency synthesizer section 12 and selector section 16. If such comparison indicates that the calculation difference $\Delta f_c$ is greater than the frequency of the local oscillator signal, $f_{LO}$, the variable n is incremented by a one and is multiplied by the frequency of the local oscillator signal to produce a new product which is subtracted from the frequency being synthesized with the calculated difference again being compared to the frequency of the local oscillator signal. It follows then that once the computer 11 indicates that the calculated difference $\Delta f_c$ is less than the frequency of the local oscillator signal, the residue of the frequency being synthesized modulo $f_{LO}$, (i.e. the frequency $f_T - Nf_{LO}$) together with the nearest modulus, $Nf_{LO}$, have been calculated by the computer 11.

The frequency of the signal being synthesized, $f_T$, and the calculated nearest modulus $Nf_{LO} = f_c$ are fed to the intermediate frequency signal section 12. The intermediate frequency signal section 12 is here the intermediate frequency signal section described, and also numerically designated 12, in my U.S. Pat. 4,240,034 referred to above. In response to such calculated data, (i.e. $f_T$ and $f_d = Nf_{LO}$) intermediate frequency synthesizer section 12 produces a pair of quadrature signals having as the fundamental frequency, a frequency ($f_T - f_c$). Thus the pair of quadrature signals produced by the intermediate frequency signal section 12 may be represented as:

$$\sin 2\pi(f_T - f_c)t; \quad (1)$$

$$-\cos 2\pi(f_T - f_c)t; \quad (2)$$

respectively.

These signals are fed to the harmonic generator section 14. Harmonic generator section 14 includes a pair of double balanced mixers 20, 22 each one being fed by a corresponding one of the quadrature signals produced by the intermediate frequency signal section 12 as indicated. A local oscillator 24 is included in the harmonic generator section 14 and is coupled directly to mixer 22 and indirectly to mixer 20 through a 90° phase delay network 26 as shown. The quadrature generation of the local oscillator signals for the mixers 20, 22 may be provided using a conventional quadrature hybrid coupler to provide the 90° phase delay of the phase shifter 26. Further, the local oscillator 24 may be of any conventional design and here includes a step recovery diode to produce the 2nd through 26th harmonics of a fundamental frequency of 500 MHz and is similar to the local oscillator described in my U.S. Pat. No. 4,137,497 issued June 30, 1979 and also to a pulse generator-oscillator-sampler combination described in U.S. Pat. No. 4,349,918, issued Sept. 14, 1982 of Bruce E. Gordon, and assigned to the same assignee as the present invention. That is, as described in U.S. Pat. No. 4,349,918 the process of heterodyning using balanced mixers is equivalent to sampling a signal since the sampling pulses may be viewed in the frequency domain, as having a relatively wide spectrum of frequencies.

It follows then that a plurality of, here thirteen, local oscillator signals is produced by the local oscillator 24, such signals including the second through twenty sixth harmonics of the frequency of the local oscillator signal, such signals being represented as:

$$\sum_{n=2}^{26} \sin 2\pi n f_{LO} t \quad (3)$$

These signals are fed directly to mixer 22; however, because of the phase shifter 26, the signals fed to mixer 22 by local oscillator 24 may be represented as:

$$\sum_{n=2}^{26} -\cos 2\pi n f_{LO} t \quad (4)$$

It follows then that mixers 20, 22 produce signals having a plurality of frequency components and which may be represented as:

$$\tfrac{1}{2}\sum_{n=2}^{26} [-\cos 2\pi(f_T - f_c + nf_{LO})t - \cos(2\pi(f_T - f_c - nf_{LO})t] \quad (5)$$

and $$\tfrac{1}{2}\sum_{n=2}^{26} [-\cos 2\pi(f_T - f_c + nf_{LO})t + \cos 2\pi(f_T - f_c - nf_{LO})t, \quad (6)$$

respectively.

The signals produced at the output of mixers 20, 22 are fed to a conventional power combiner 28 which, in effect, adds the frequency components of the signals produced by mixers 20, 22 to produce a composite signal having a plurality of frequency components which may be represented as:

$$\sum_{n=2}^{26} \cos 2\pi(f_T - f_c + nf_{LO})t. \quad (7)$$

It is noted that the composite signal has a plurality of frequency components separated one from another by the frequency of the local oscillator signal; one of such frequency components however has the frequency of the signals being synthesized, i.e. the frequency $f_T$. For example, let us consider that the frequency of the signal being synthesized is 11.783 GHz as shown in FIG. 3A and that the fundamental frequency of the local oscillator, i.e. $f_{LO}$ is 500 MHz. Thus the local oscillator signals fed to mixers 20, 22 have the frequencies:

$$\sum_{n=2}^{26} nf_{LO} \quad (8)$$

where $f_{LO} = 500$ MHz, as shown in FIG. 3B. In this case, the computer 11 determines the residue of the frequency to be synthesized modulo 500 MHz is $(f_T-f_c)=283$ MHz, as shown in FIG. 3D, and also determines that the nearest modulus $Nf_{LO}=f_c$ is 11.500 GHz as shown in FIG. 3C (with N in effect being determined to be equal to 23). It follows then that the frequency components of the composite signal produced at the output of combiner 14 will have the following frequency components:

$$\sum_{n=2}^{26} (f_T - f_c + nf_{LO}), \text{ here:} \quad (9)$$

1.283; 1.783, 2.283, ... 11.283, 11.783, 12.283, 12.783 and 13.283. It is noted that one of such frequency components, i.e. the 23rd frequency component has a frequency of 11.783 GHz; i.e the frequency being synthesized.

The composite signal produced by combiner 28 is fed to selector section 16. Also fed to selector section 16 is the nearest modulus $Nf_{LO}=f_c$, calculated by computer 11 as described above and shown in FIG. 3C. Thus, in the example referred to above, N is an integer from 2 to 26 and in the example above since the calculated nearest modulus is the frequency 11.500 GHz, N is 23. The nearest modulus data is fed to the selector section 16. Selector section 16 includes a filter bank 30 comprising a plurality of here twenty-five band pass filters 32a–32y, each one of such filters having a 500MHz bandwidth, each one of such filters however have a different center frequency, the center frequencies of filters 32a–32y being 1.25 GHz; 1.75 GHz; 2.25 GHz; 2.75 GHz; 3.25 GHz; 3.75 GHz; 4.25 GHz; 4.75 GHz; 5.25 GHz; 5.75 GHz; 6.25 GHz; 6.75 GHz; 7.25 GHz; 7.75 GHz; 8.25 GHz; 8.75 GHz; 9.25 GHz; 9.75 GHz; 10.25 GHz; 10.75 GHz; 11.25 GHz; 11.75 GHz; 12.25 GHz; 12.75 GHz; and, 13.25 GHz as shown in FIG. 3F. The output of band pass filters 32a–32y are fed to a switch 34 as shown. Switch 34 is here any conventional radio frequency signal adapted to couple the output of one of the band pass filters 32a–32y to a radio frequency amplifier 38, here a travelling wave tube (TWT) selectively in response to a logical control signal on lines 40a–40y. The generation of the logical control signal will be described hereinafter. Suffice it to say here, however, that switch 34 in response to such control signals produced by decoder 44 on lines 40a to 40y couples only one of the twenty-five band pass filters 32a–32y to travelling wave tube 38; the one of the filters having its pass band include the frequency of the signal being synthesized. The other ones of the plurality of frequency components of the composite signal produced by combiner 28 are thus rejected by the operation of switch 34 and hence are not coupled to travelling wave tube 38. However, the one of the frequency components of the composite signal produced by combiner 28 having the frequency being synthesized is fed through the selected one of the filters 32a–32y via switch 34 to travelling wave tube 38 for amplification and transmission by antenna 42. Also included in selector section 16 is a decoder 44. Decoder 44 is of any conventional design and, in response to the computed nearest modulus frequency $f_c = Nf_{LO}$ produces the control signal on lines 48a–48n, that couple the output of the selected one of the band pass filters 32a–32n through switch 34 to travelling wave tube 38. Here decoder 44 provides enabling signals to one of the lines 40a–40y respectively in response to the calculated modulus frequncies (here 1.0 GHz to 13.0 GHz, respectively), Thus, in the example referred to above in response to the nearest modulus frequency 11.5 GHz (i.e. N=23) determined by computer 11, decoder 44 enables switch 34 to couple the one of the band pass filters 32a–32n having a band pass between 11.5 GHz and 12 GHz, here the twenty-third filter 32v. Thus in the example, in response to $f_c=11.5$ GHz, line 40v is enabled to allow filter 32v to be coupled between the output of combiner 14 and the input of TWT 38. In this way, the twenty-third frequency component 11.783, labelled 23 in FIG. 3E, is allowed to pass through filter 32y, which has a band pass from 11.5 GHz to 12.0 GHz, while all other frequency components of the composite signal are thereby rejected. It follows then that digital frequency synthesizer 10 is adapted to produce a radio frequency signal having a predetermined frequency within an extremely large range of frequencies.

Having described a preferred embodiment of this invention, it is evident that other embodiments incorporating these concepts may be used, for example, other local oscillator frequencies and other operating bandwidths may be used. It is felt, therefore, that this invention should not be restricted to the disclosed embodiment, but rather should be restricted only by the spirit and scope of the appended claims.

What is claimed is:

1. A digital frequency synthesizer for producing a signal having a frequency $f_T$, comprising:
    (a) means, responsive to an indication of the frequency $f_T$ and an indication of the fundamental frequency $f_{LO}$ of a predetermined fundamental frequency signal, for determining a frequency equal to the difference between the frequency $f_T$ and a particular harmonic of the fundamental frequency, $f_{LO}$, where said particular harmonic, $Nf_{LO}$ is selected such that is less than, or equal to, the fundamental frequency $f_{LO}$;
    (b) means, responsive to an indication of the frequency $f_T$ and to said particular harmonic $Nf_{LO}$, for generating an intermediate frequency signal having a frequency equal to said determined frequency $f_T - Nf_{LO}$;
    (c) means, responsive to said intermediate frequency signal and a plurality of harmonics of the fundamental frequency signal, for combining the intermediate frequency signal with said plurality of harmonics of the fundamental frequency signal, to produce a composite signal having a plurality of frequency components separated in frequency one from another by the fundamental frequency, $f_{LO}$, one of such produced plurality of frequency components having the frequency $f_T$; and,
    (d) means fed by the composite signal and responsive to the harmonic $Nf_{LO}$ for coupling the one of the produced plurality of frequency components of the composite signal having the frequency $f_T$ to an output while rejecting remaining ones of the produced plurality of frequency components of the composite signal.

2. The frequency synthesizer recited in claim 1 wherein the generating means includes: means for generating a pair of quadrature intermediate frequency signals each having the frequency $f_T - Nf_{LO}$; and wherein the combining means includes a pair of mixers fed by: (i) the pair of quadrature intermediate frequency signals; and (ii) the plurality of harmonics of the fundamental frequency signal.

3. Apparatus for synthesizing a signal having a predetermined frequency $f_T$:
 (a) means, responsive to an indication of the frequency $f_T$ and an indication of the fundamental frequency $f_{LO}$ of a predetermined fundamental frequency signal, for producing a signal indicative of a selected harmonic, $Nf_{LO}$, of said fundamental frequency $f_{LO}$, such selected harmonic $Nf_{LO}$ being and one of the harmonics separated from the predetermined frequency $f_T$ of the signal being synthesized such that $\Delta f_c = f_T - Nf_{LO}$ where $\Delta f_c$ is less than the fundamental frequency $f_{LO}$;
 (b) means, responsive to the produced signal indicative of the selected harmonic $Nf_{LO}$ and the predetermined frequency $f_T$, for generating a signal having a frequency $\Delta f_c = f_T - Nf_{LO}$;
 (c) means for combining the generated signal of the frequency $\Delta f_c$ with a plurality of harmonics of the fundamental frequency signal producing a composite signal having a plurality of frequency components separated one from anothe by the fundamental frequency, one of such frequency components being the frequency $f_T$; and
 (d) means, responsive to the signal indicative of the selected harmonic $Nf_{LO}$, and fed by the composite signal, for passing the one of the frequency components of the composite signal having the frequency $f_T$ and for rejecting other ones of the produced frequency components of the composite signal.

4. The frequency synthesizer recited in claim 3 wherein the generating means includes: means for generating a pair of quadrature intermediate frequency signals each having the frequency $f_T - Nf_{LO}$ and wherein the combining means includes a pair of mixers fed by: (i) the pair of quadrature intermediate frequency signals; and, (ii) the plurality of harmonics of the fundamental frequency signal.

* * * * *

UNITED STATES PATENT OFFICE
CERTIFICATE OF CORRECTION

Patent No. 4,558,282          Dated December 10, 1985

Inventor(s) Oscar Lowenschuss

It is certified that error appears in the above-identified patent and that said Letters Patent are hereby corrected as shown below:

Column 1, Line 10: Change "of" (second occurrence) to --or--;

Column 3, Line 43: Change "$f_d = Nf_{LO}$" to --$f_c = Nf_{LO}$--;

Column 5, Line 67: Change "frequncies" to --frequencies--;

Column 6, Claim 1, Line 33: After "frequency" (second occurrence) insert --$f_T - Nf_{LO}$--;

Column 6, Claim 1, Line 35: After "harmonic" insert --$Nf_{LO}$--;

Column 6, Claim 1, Line 37: After "that" insert --$f_T - Nf_{LO}$--;

UNITED STATES PATENT AND TRADEMARK OFFICE
CERTIFICATE OF CORRECTION

PATENT NO. : 4,558,282

DATED : December 10, 1985

INVENTOR(S) : Oscar Lowenschuss

It is certified that error appears in the above-identified patent and that said Letters Patent is hereby corrected as shown below:

Column 7, Claim 3, Line 9:  Change "and" to --the--; and,

Column 8, Claim 3, Line 2:  Change "anothe" to --another--.

Signed and Sealed this

First Day of July 1986

[SEAL]

Attest:

Attesting Officer

DONALD J. QUIGG

Commissioner of Patents and Trademarks